United States Patent
Khesbak et al.

(10) Patent No.: US 10,236,831 B2
(45) Date of Patent: Mar. 19, 2019

(54) ENVELOPE TRACKERS PROVIDING COMPENSATION FOR POWER AMPLIFIER OUTPUT LOAD VARIATION

(71) Applicant: SKYWORKS SOLUTIONS, INC., Woburn, MA (US)

(72) Inventors: Sabah Khesbak, Irvine, CA (US); Serge Francois Drogi, Flagstaff, AZ (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/969,075

(22) Filed: May 2, 2018

(65) Prior Publication Data
US 2018/0331659 A1    Nov. 15, 2018

Related U.S. Application Data

(60) Provisional application No. 62/505,275, filed on May 12, 2017.

(51) Int. Cl.
*H04K 1/02* (2006.01)
*H03F 1/02* (2006.01)
(Continued)

(52) U.S. Cl.
CPC .............. *H03F 1/0255* (2013.01); *H03F 3/19* (2013.01); *H03F 3/21* (2013.01); *H03G 3/3042* (2013.01);
(Continued)

(58) Field of Classification Search
CPC . H03F 1/0255; H03F 3/19; H03F 3/21; H03F 2200/102; H03F 2200/336;
(Continued)

(56) References Cited

U.S. PATENT DOCUMENTS 5,264,752 A    11/1993   Savicki
6,407,634 B1   6/2002    Staudinger et al.
(Continued)

FOREIGN PATENT DOCUMENTS

GB    2398648    8/2004
GB    2409115    11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Pablo N Tran
(74) *Attorney, Agent, or Firm* — Knobbe Martens Olson & Bear LLP

(57) ABSTRACT

Envelope trackers providing compensation for power amplifier output load variation are provided herein. In certain configurations, a radio frequency (RF) system includes a power amplifier that amplifies an RF signal, an output detector coupled to an output of the power amplifier and that generates an output detection signal, an input detector coupled to an input of the power amplifier and that generates an input detection signal, and an envelope tracker that generates a power amplifier supply voltage for the power amplifier based on an envelope of the RF signal. The envelope tracker compensates the power amplifier for output load variation based on the output detection signal and the input detection signal.

20 Claims, 14 Drawing Sheets

(51) Int. Cl.
*H03F 3/19* (2006.01)
*H03F 3/21* (2006.01)
*H03G 3/30* (2006.01)
*H04B 1/04* (2006.01)

(52) U.S. Cl.
CPC ..... *H04B 1/0475* (2013.01); *H03F 2200/102* (2013.01); *H03F 2200/336* (2013.01); *H03F 2200/387* (2013.01); *H03F 2200/417* (2013.01); *H03F 2200/451* (2013.01); *H03F 2200/471* (2013.01); *H03G 2201/307* (2013.01); *H04B 2001/0408* (2013.01)

(58) Field of Classification Search
CPC ......... H03F 2200/387; H03F 2200/417; H03F 2200/451; H03F 2200/471; H03F 1/0277; H03F 1/02; H03G 3/3042; H03G 2201/307; H04B 1/0475; H04B 2201/0408; H04F 1/02
See application file for complete search history.

(56) References Cited

U.S. PATENT DOCUMENTS

| | | | |
|---|---|---|---|
| 6,583,664 B2 | 6/2003 | Mathe et al. | |
| 6,646,501 B1* | 11/2003 | Wessel | H03F 1/0222 330/10 |
| 6,914,487 B1* | 7/2005 | Doyle | H03F 1/0222 330/129 |
| 7,482,869 B2 | 1/2009 | Wilson | |
| 7,761,065 B2 | 7/2010 | Drogi et al. | |
| 8,000,409 B2* | 8/2011 | Chan | H04W 52/343 375/297 |
| 8,094,764 B2 | 1/2012 | Lackey | |
| 8,183,917 B2 | 5/2012 | Drogi et al. | |
| 8,587,377 B2 | 11/2013 | Khesbak et al. | |
| 8,610,499 B2* | 12/2013 | Royer | H03F 1/3247 330/149 |
| 8,620,238 B2* | 12/2013 | Chan | H03G 3/3042 455/126 |
| 8,680,833 B2* | 3/2014 | Wilson | H03F 1/0227 323/234 |
| 8,731,496 B2 | 5/2014 | Drogi et al. | |
| 8,803,605 B2 | 8/2014 | Fowers et al. | |
| 8,947,162 B2 | 2/2015 | Wimpenny et al. | |
| 9,065,385 B2 | 6/2015 | Gorbachov | |
| 9,066,368 B2 | 6/2015 | Lorenz et al. | |
| 9,445,371 B2 | 9/2016 | Khesbak et al. | |
| 9,571,048 B2* | 2/2017 | Ortiz | H03F 1/565 |
| 9,667,196 B2 | 5/2017 | Midya | |
| 9,668,215 B2 | 5/2017 | Balteanu et al. | |
| 9,748,912 B2 | 8/2017 | Choi et al. | |
| 9,876,473 B2 | 1/2018 | Khesbak et al. | |
| 2002/0030543 A1 | 3/2002 | French et al. | |
| 2002/0101912 A1 | 8/2002 | Phelts et al. | |
| 2003/0155978 A1 | 8/2003 | Pehlke | |
| 2004/0083409 A1 | 4/2004 | Rozenblit et al. | |
| 2004/0198271 A1 | 10/2004 | Kang | |
| 2005/0064830 A1 | 3/2005 | Grigore | |
| 2005/0070233 A1 | 3/2005 | Sowlati | |
| 2005/0110562 A1 | 5/2005 | Robinson et al. | |
| 2006/0119425 A1 | 6/2006 | Phillips et al. | |
| 2007/0210771 A1 | 9/2007 | Wilson et al. | |
| 2007/0249304 A1 | 10/2007 | Snelgrove et al. | |
| 2007/0273449 A1 | 11/2007 | Wilson | |
| 2007/0279019 A1 | 12/2007 | Wilson | |
| 2008/0238387 A1 | 10/2008 | Schmeller et al. | |
| 2009/0004981 A1 | 1/2009 | Eliezer et al. | |
| 2009/0016086 A1 | 1/2009 | Huynh et al. | |
| 2009/0097591 A1 | 4/2009 | Kim | |
| 2009/0128236 A1 | 5/2009 | Wilson | |
| 2009/0289720 A1 | 11/2009 | Takinami et al. | |
| 2009/0302941 A1 | 12/2009 | Wimpenny | |
| 2011/0058601 A1 | 3/2011 | Kim et al. | |
| 2012/0139641 A1 | 6/2012 | Kaczman et al. | |
| 2012/0146731 A1 | 6/2012 | Khesbak | |
| 2012/0200354 A1 | 8/2012 | Ripley et al. | |
| 2012/0201065 A1 | 8/2012 | Nate et al. | |
| 2012/0269240 A1 | 10/2012 | Balteanu et al. | |
| 2012/0326783 A1 | 12/2012 | Mathe et al. | |
| 2013/0034139 A1 | 2/2013 | Khlat et al. | |
| 2013/0109441 A1 | 5/2013 | Lorenz et al. | |
| 2013/0109442 A1 | 5/2013 | Dakshinamurthy et al. | |
| 2013/0116017 A1 | 5/2013 | Zhang et al. | |
| 2013/0127548 A1 | 5/2013 | Popplewell et al. | |
| 2013/0200864 A1 | 8/2013 | Huang et al. | |
| 2013/0207731 A1 | 8/2013 | Balteanu | |
| 2013/0217345 A1 | 8/2013 | Balteanu et al. | |
| 2013/0231069 A1 | 9/2013 | Drogi | |
| 2013/0293210 A1 | 11/2013 | Smith et al. | |
| 2014/0049321 A1 | 2/2014 | Gebeyehu et al. | |
| 2014/0155127 A1* | 6/2014 | Dakshinamurthy | H04W 52/028 455/574 |
| 2014/0213204 A1 | 7/2014 | Balteanu et al. | |
| 2014/0218109 A1 | 8/2014 | Wimpenny | |
| 2014/0240052 A1 | 8/2014 | Mao | |
| 2014/0300334 A1 | 10/2014 | Popplewell et al. | |
| 2014/0306763 A1 | 10/2014 | Hong et al. | |
| 2014/0312974 A1 | 10/2014 | Khesbak et al. | |
| 2014/0312977 A1 | 10/2014 | Kaczman et al. | |
| 2014/0361830 A1 | 12/2014 | Mathe et al. | |
| 2014/0361837 A1 | 12/2014 | Strange et al. | |
| 2015/0009980 A1 | 1/2015 | Modi et al. | |
| 2015/0105033 A1 | 4/2015 | Modi et al. | |
| 2015/0155834 A1 | 6/2015 | Ripley et al. | |
| 2015/0180421 A1 | 6/2015 | Balteanu et al. | |
| 2015/0188432 A1 | 7/2015 | Vannorsdel et al. | |
| 2015/0236654 A1 | 8/2015 | Jiang et al. | |
| 2015/0270806 A1 | 9/2015 | Wagh et al. | |
| 2015/0326184 A1 | 11/2015 | Balteanu et al. | |
| 2015/0365053 A1 | 12/2015 | Wimpenny | |
| 2016/0006396 A1 | 1/2016 | Wimpenny | |
| 2016/0006397 A1 | 1/2016 | Wimpenny | |
| 2016/0036389 A1 | 2/2016 | Balteanu et al. | |
| 2016/0050629 A1 | 2/2016 | Khesbak et al. | |
| 2016/0094192 A1 | 3/2016 | Khesbak et al. | |
| 2016/0099742 A1 | 4/2016 | Ripley et al. | |
| 2016/0118943 A1 | 4/2016 | Khesbak | |
| 2016/0174153 A1 | 6/2016 | Balteanu et al. | |
| 2016/0261239 A1 | 9/2016 | Khesbak et al. | |
| 2016/0336901 A1 | 11/2016 | Khesbak et al. | |
| 2017/0005625 A1 | 1/2017 | Zhu et al. | |
| 2017/0033747 A1* | 2/2017 | Balteanu | H03F 1/0266 |
| 2017/0047953 A1 | 2/2017 | Balteanu et al. | |
| 2017/0093347 A1 | 3/2017 | Zhu et al. | |
| 2017/0093505 A1 | 3/2017 | Ripley et al. | |
| 2017/0179889 A1 | 6/2017 | Khesbak et al. | |
| 2017/0195972 A1 | 7/2017 | Drogi et al. | |
| 2017/0223632 A1 | 8/2017 | Balteanu et al. | |
| 2018/0034416 A1* | 2/2018 | Duncan | H03F 1/0216 |
| 2018/0076772 A1 | 3/2018 | Khesbak et al. | |
| 2018/0234060 A1* | 8/2018 | Langer | H03F 3/19 |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

(56) References Cited

OTHER PUBLICATIONS

Kaneta et al. "Architecture of Wideband High-Efficiency Envelope Tracking Power Amplifier for Base Station," IEICE Technical Report, Osaka, 2009.
Kang et al. "A Multimode/Multiband Power Amplifier With a Boosted Supply Modulator," IEEE Transactions on Microwave Theory and Techniques, vol. 58, No. 10, Oct. 2010, pp. 2598-2608.
Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.
Wu et al. "A Two-Phase Switching Hybrid Supply Modulator for Polar Transmitters with 9% Efficiency Improvement," IEEE International Solid-State Circuits Conference, Feb. 2010, pp. 196-198.
Yousefzadeh et al. "Three-Level Buck Converter for Envelope Tracking Applications," IEEE Transactions on Power Electronics, vol. 21, No. 2, Mar. 2006, pp. 549-552.

\* cited by examiner

US 10,236,831 B2

ENVELOPE TRACKERS PROVIDING COMPENSATION FOR POWER AMPLIFIER OUTPUT LOAD VARIATION

CROSS-REFERENCE TO RELATED APPLICATIONS

This application claims the benefit of priority under 35 U.S.C. § 119 of U.S. Provisional Patent Application No. 62/505,275, filed May 12, 2017 and titled "ENVELOPE TRACKERS PROVIDING COMPENSATION FOR POWER AMPLIFIER OUTPUT LOAD VARIATION," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) systems to amplify RF signals for transmission via antennas. It is important to manage the power of RF signal transmissions to prolong battery life and/or to provide a suitable transmit power level.

Examples of RF systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kilohertz (kHz) to 300 gigahertz (GHz), such as in the range of about 450 megahertz (MHz) to about 6 GHz for certain communications standards.

SUMMARY

In certain embodiments, the present disclosure relates to a radio frequency system. The radio frequency system includes a power amplifier including an input configured to receive a radio frequency signal and an output configured to provide an amplified radio frequency signal. The power amplifier is configured to receive power from a power amplifier supply voltage. The radio frequency system further includes an output detector coupled to the output of the power amplifier and configured to generate an output detection signal, an input detector coupled to the input of the power amplifier and configured to generate an input detection signal, and an envelope tracker configured to generate the power amplifier supply voltage based on an envelope of the radio frequency signal and to compensate the power amplifier for output load variation based on the output detection signal and the input detection signal.

In various embodiments, at least one of the input detector or the output detector includes a peak detector.

In a number of embodiments, at least one of the input detector or the output detector includes an average detector.

In several embodiments, at least one of the input detector or the output detector includes a directional coupler.

In some embodiments, at least one of the input detector or the output detector includes a voltage detector.

In various embodiments, the output detection signal indicates a standing wave voltage at the output of the power amplifier.

In some embodiments, the output detection signal indicates a voltage gain at the output of the power amplifier, the envelope tracker configured to provide compensation for output load variation based on comparing the voltage gain to a target gain.

In a number of embodiments, the output detection signal indicates both a voltage gain and a forward gain at the output of the power amplifier, and the envelope tracker is configured to provide compensation for output load variation based on comparing the voltage gain to the forward gain.

In several embodiments, the output detection signal indicates both a forward wave and a reverse wave at the output of the power amplifier.

In various embodiments, the input detection signal indicates an input power level of the power amplifier.

In some embodiments, the envelope tracker includes a load variation detector configured to generate a load variation detection signal based on compensating an output load variation indicated by the output detection signal by a nominal output load variation indicated by the input detection signal. According to several embodiments, the envelope tracker is configured to adjust at least one of a voltage level of the power amplifier supply voltage or a gain of the power amplifier based on the load variation detection signal. In accordance with a number of embodiments, the envelope tracker includes an envelope modulator configured to generate the power amplifier supply voltage based on a shaped envelope signal, and an envelope adjustment circuit configured to generate the shaped envelope signal based on shaping the envelope of the radio frequency signal. According to various embodiments, the envelope adjustment circuit includes a shaping table, and the envelope adjustment circuit is configured to select a gain adjustment value of the shaping table based on the load variation detection signal. In accordance with several embodiments, the envelope modulator includes a DC-to-DC converter and an amplifier configured to operate in combination with one another to generate the power amplifier supply voltage.

In a number of embodiments, the radio frequency system further includes a duplexing and switching circuit coupled to the output of the power amplifier, the output detector configured to provide output detection prior to the duplexing and switching circuit.

In certain embodiments, the present disclosure relates to a mobile device. The mobile device includes a transceiver configured to generate a radio frequency signal, a front end system, and a power management system including an envelope tracker. The front end system includes a power amplifier configured to provide amplification to the radio frequency signal, an output detector configured to generate an output detection signal indicating an output signal condition of the power amplifier, and an input detector configured to generate an input detection signal indicating an input signal condition of the power amplifier. The envelope tracker is configured to generate a power amplifier supply voltage of the power amplifier based on an envelope of the radio frequency signal, and the envelope tracker is further configured to compensate the power amplifier for output load variation based on the output detection signal and the input detection signal.

In a number of embodiments, the mobile device further includes an antenna configured to receive an amplified radio frequency signal from the power amplifier, and the envelope tracker is configured to compensate the power amplifier for output load variation arising from a voltage standing wave ratio condition of the antenna.

In several embodiments, at least one of the input detector or the output detector includes a peak detector.

In some embodiments, at least one of the input detector or the output detector includes an average detector.

In various embodiments, at least one of the input detector or the output detector includes a directional coupler.

In a number of embodiments, at least one of the input detector or the output detector includes a voltage detector.

In various embodiments, the output detection signal indicates a standing wave voltage at the output of the power amplifier.

In several embodiments, the output detection signal indicates both a voltage gain and a forward gain of the power amplifier, and the envelope tracker is configured to provide compensation for output load variation based on comparing the voltage gain to the forward gain.

In a number of embodiments, the output detection signal indicates both a forward wave and a reverse wave at an output of the power amplifier.

In some embodiments, the output detection signal indicates a voltage gain of the power amplifier, and the envelope tracker is configured to provide compensation for output load variation based on comparing the voltage gain to a target gain.

In various embodiments, the output detection signal indicates both a voltage gain and a forward gain of the power amplifier, and the envelope tracker is configured to provide compensation for output load variation based on comparing the voltage gain to the forward gain.

In several embodiments, the input detection signal indicates an input power level of the power amplifier.

In some embodiments, the envelope tracker includes a load variation detector configured to generate a load variation detection signal based on compensating an output load variation indicated by the output detection signal by a nominal output load variation indicated by the input detection signal. According to various embodiments, the envelope tracker is configured to adjust at least one of a voltage level of the power amplifier supply voltage or a gain of the power amplifier based on the load variation detection signal. In accordance with a number of embodiments, the envelope tracker includes an envelope modulator configured to generate the power amplifier supply voltage based on a shaped envelope signal, and an envelope adjustment circuit configured to generate the shaped envelope signal based on shaping the envelope of the radio frequency signal. According to several embodiments, the envelope adjustment circuit includes a shaping table, and the envelope adjustment circuit is configured to select a gain adjustment value of the shaping table based on the load variation detection signal. In accordance with various embodiments, the envelope modulator includes a DC-to-DC converter and an amplifier configured to operate in combination with one another to generate the power amplifier supply voltage.

In certain embodiments, the present disclosure relates to a method of envelope tracking in a radio frequency system. The method includes amplifying a radio frequency signal using a power amplifier, generating an output detection signal indicating an output signal condition of the power amplifier using an output detector of the power amplifier, generating an input detection signal indicating an input signal condition of the power amplifier using an input detector of the power amplifier, generating a power amplifier supply voltage for the power amplifier based on an envelope of the radio frequency signal using an envelope tracker, and compensating the power amplifier for output load variation based on the output detection signal and the input detection signal using the envelope tracker.

In a number of embodiments, the method further includes compensating the power amplifier for output load variation arising from a voltage standing wave ratio condition of an antenna.

In some embodiments, generating the input detection signal includes performing at least one of peak detection or average detection.

In several embodiments, generating the output detection signal includes performing at least one of peak detection or average detection.

In a number of embodiments, the method further includes determining a standing wave voltage at an output of the power amplifier. According to several embodiments, the method further includes determining a voltage gain of the power amplifier, and providing compensation for output load variation based on comparing the voltage gain to a target gain.

In some embodiments, the method further includes determining a voltage gain and a forward gain of the power amplifier, and providing compensation for output load variation based on comparing the voltage gain to the forward gain.

In various embodiments, the method further includes, determining a forward wave and a reverse wave at an output of the power amplifier.

In several embodiments, the method further includes generating a load variation detection signal based on compensating an output load variation indicated by the output detection signal by a nominal output load variation indicated by the input detection signal, and providing compensation for output load variation based on the load variation detection signal.

DETAILED DESCRIPTION OF EMBODIMENTS

Figure 1:
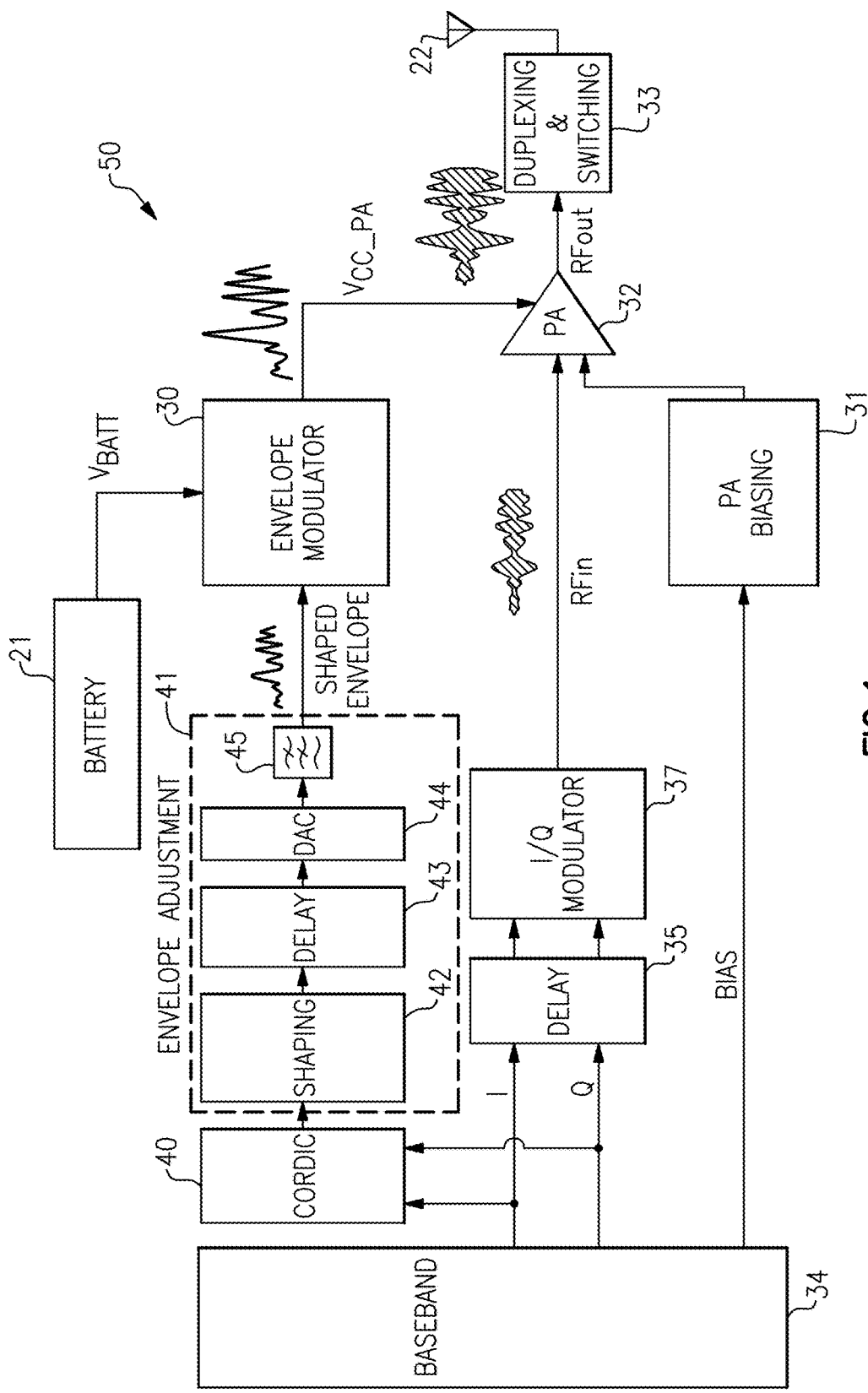
FIG. 1 is a schematic diagram of one embodiment of a transmission system for transmitting radio frequency (RF) signals.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Power added efficiency (PAE) is one metric for rating a power amplifier, and can correspond to the ratio of the difference between the output and input signal power to the DC power consumed by the power amplifier.

Envelope tracking is a technique that can be used to increase PAE of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

To maintain linearity when using envelope tracking, an envelope tracking system can use a shaping table that maps or converts an envelope signal to a shaped envelope signal. For example, an isogain shaping table is calibrated to provide mapping between envelope signal levels and corresponding shaped envelope signal levels while maintaining a substantially constant gain across an envelope signal range. Using an isogain shaping table in an envelope tracking system can provide high linearity over the range of the signal's envelope, thereby helping to ensure that the power amplifier is compliant with a particular communications standard.

A variation in voltage standing wave ratio (VSWR) at an antenna can lead to a change in standing wave ratio at the output of the power amplifier. Thus, variation in VSWR can cause changes in the load of the power amplifier, which in turn can lead to a change in the gain of the power amplifier. For example, the power amplifier's gain can increase or decrease in response to variation in load line impedance.

Output load variation can lead to the power amplifier operating away from a desired gain and efficiency trajectory, thereby leading to degradation in signaling and/or power performance. For instance, in envelope tracking systems that operate with an isogain shaping table, variations in output load can result in the power amplifier operating under higher or lower compression than desired.

Envelope trackers providing compensation for power amplifier output load variation are provided herein. In certain configurations, an RF system includes a power amplifier that amplifies an RF signal, an output detector coupled to an output of the power amplifier and that generates an output detection signal, an input detector coupled to an input of the power amplifier and that generates an input detection signal, and an envelope tracker that generates a power amplifier supply voltage for the power amplifier based on an envelope of the RF signal. The envelope tracker compensates the power amplifier for output load variation based on the output detection signal and the input detection signal.

For example, the envelope tracker can include a load variation detector that generates a load variation detection signal based on determining an output load variation indicated by the output detection signal as compensated for by a nominal variation in output load indicated by the input detection signal. For instance, a change in input power level of the RF signal can lead to a nominal output load variation. By correcting for nominal output load variation, a component of output load variation corresponding to the power amplifier's standing wave ratio can be detected.

Thus, the envelope tracker can provide compensation for variation in the power amplifier's load line impedance arising from changes in VSWR.

The output load variation can be detected using detectors implemented in a wide variety of ways.

In a first example, the output detector detects the standing wave voltage at the power amplifier's output. For instance, the output detector can be implemented as a peak detector.

In a second example, the output detector generates the output detection signal to indicate a voltage gain of the power amplifier, which can be compared to a target gain. For instance, the output detector can be implemented as an average detector.

In a third example, the output detector measures both the voltage gain and the forward gain at the output of the power amplifier, which can be compared to one another. For instance, the output detector can include an average detector for measuring voltage gain and a directional coupler for measuring forward gain.

In a fourth example, the output detector measures a forward wave and a reverse wave at the power amplifier's output. For instance, the output detector can include a directional coupler for measuring a forward wave and a reverse wave at the output of the power amplifier.

In certain implementations, the envelope tracker provides compensation for output load variation based on adjusting at least one of a voltage level of the power amplifier supply voltage or a gain of the power amplifier based on the load variation detection signal.

In one example, the envelope tracker includes a shaping table (for instance, an isogain shaping table) for mapping between envelope signal levels and corresponding shaped envelope signal levels. Additionally, the selected shaped envelope signal level is chosen in part based on the load variation detection signal.

In another example, the envelope tracker processes the load variation detection signal to control a value of a gain control signal of the power amplifier.

The teachings herein can be used to detect an output load condition as VSWR changes. Additionally, the envelope tracker provides compensation for output load variation to maintain the power amplifier in a region of high efficiency and linearity. For instance, the envelope tracker can lower a voltage at the power amplifier's output when output load impedance is relatively low and increase the voltage at the power amplifier's output when output load impedance is relatively high. The compensation is provided dynamically during operation of the mobile phone or other communication device.

FIG. 1 is a schematic diagram of one example of a transmission system 50 for transmitting RF signals. The transmission system 50 includes a battery 21, an antenna 22, an envelope modulator 30, a power amplifier biasing circuit 31, a power amplifier 32, a duplexing and switching circuit 33, a baseband processor 34, a signal delay circuit 35, an I/Q modulator 37, a coordinate rotation digital computation (CORDIC) circuit 40, and an envelope adjustment circuit 41. In the illustrated embodiment, the envelope adjustment circuit 41 includes a shaping circuit 42, a delay circuit 43, a digital-to-analog converter 44, and a reconstruction filter 45.

The baseband processor 34 can be used to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof.

The delay circuit 35 provides adjustable delay to the I and Q signals to aid in controlling relative alignment between the shaped envelope signal and the RF signal RFin.

The I/Q modulator 37 can be configured to receive the I and Q signals from the baseband processor 34 and to process the I and Q signals to generate an RF signal RFin. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

In the illustrated embodiment, the CORDIC circuit 40 processes the I and Q signals to generate an envelope signal corresponding to an envelope of the RF signal RFin. Although FIG. 1 illustrates an implementation using a CORDIC circuit to generate an envelope signal, an envelope signal can be obtained in other ways.

The envelope adjustment circuit 41 includes the shaping circuit 42, which is used to shape the envelope signal to enhance the performance of the transmission system 50. In certain implementations, the shaping circuit 42 includes a shaping table that maps each level of the envelope signal to a corresponding shaped envelope signal level. The delay circuit 43 provides adjustable delay to aid in controlling relative alignment between the shaped envelope signal and the RF signal RFin. In the illustrated embodiment, the delayed envelope signal generated by the delay circuit 43 is a digital signal, which is converted by the DAC 44 to an analog envelope signal. Additionally, the analog envelope signal is low pass filtered by the reconstruction filter 45 to generate a shaped envelope signal suitable for use by the envelope modulator 30.

The envelope modulator 30 can receive the shaped envelope signal from the envelope adjustment circuit 41 and a battery voltage $V_{BATT}$ from the battery 21, and can use the shaped envelope signal to generate a power amplifier supply voltage $V_{CC\_PA}$ for the power amplifier 32 that changes in relation to the envelope of the RF signal RFin. The power amplifier 32 can receive the RF signal RFin from the I/Q modulator 37 of the transceiver 33, and can provide an amplified RF signal RFout to the antenna 22 through the duplexing and switching circuit 33, in this embodiment.

Although illustrated as a single stage, the power amplifier 32 can include one or more stages. Furthermore, the teachings herein are applicable to power amplifier systems including multiple power amplifiers.

Figure 2A:
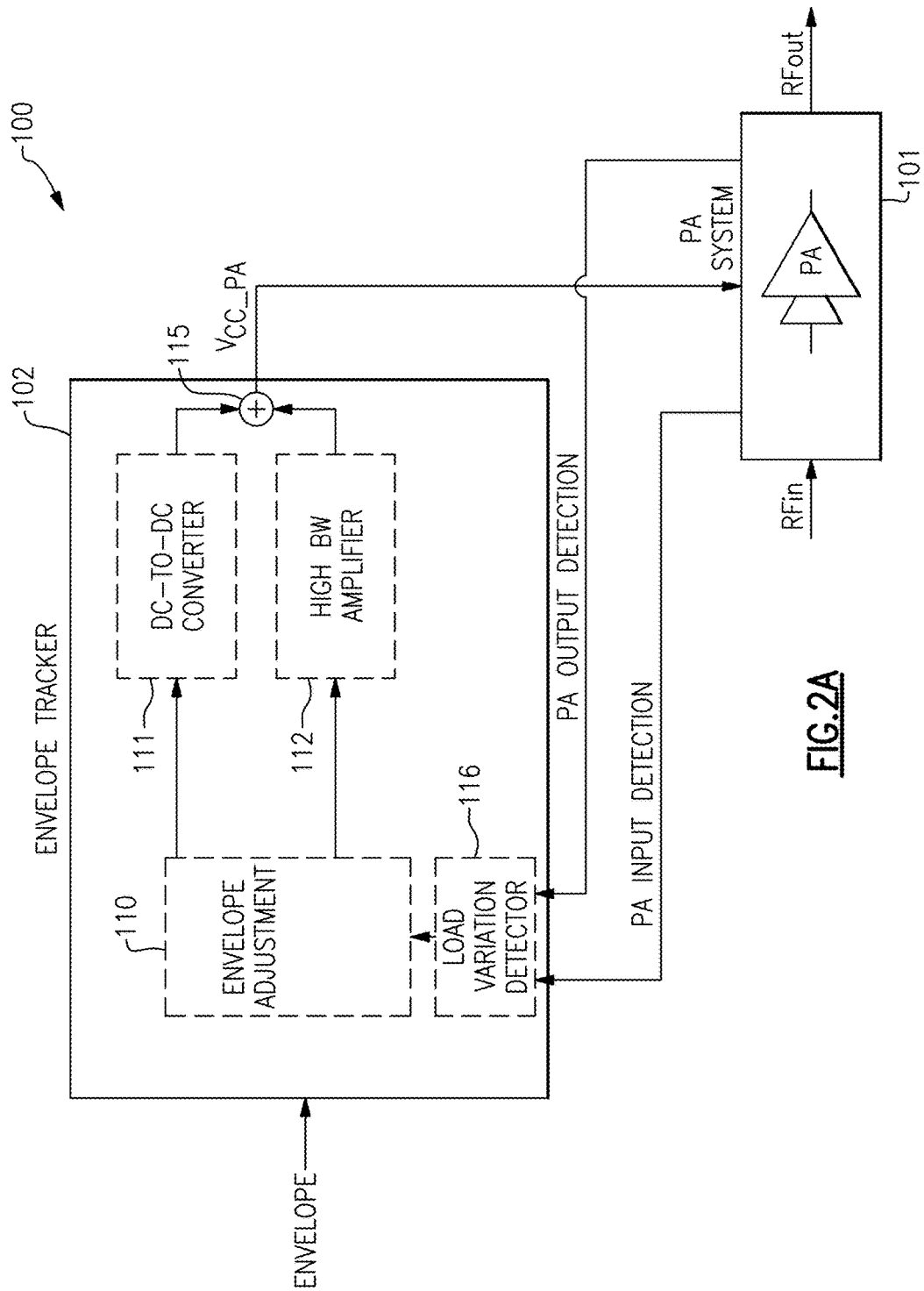
FIG. 2A is a schematic diagram of an RF system including an envelope tracker according to one embodiment.

FIG. 2A is a schematic diagram of an RF system 100 including an envelope tracker 102 according to one embodiment. The RF system 100 further includes a power amplifier system 101 including a power amplifier that amplifies an RF signal RFin to generate an amplified RF signal RFout.

The envelope tracker 102 of FIG. 2A illustrates one embodiment of an envelope tracker that provides compensation to a power amplifier for output load variation. However, the teachings herein are applicable to envelope trackers implemented in a wide variety of ways. Accordingly, other implementations are possible.

As shown in FIG. 2A, the envelope tracker 102 receives an envelope signal corresponding to an envelope of the RF signal RFin. Additionally, the envelope tracker 102 generates a power amplifier supply voltage $V_{CC\_PA}$, which supplies power to the power amplifier system 101.

The illustrated envelope tracker 102 includes an envelope modulator implemented using a DC-to-DC converter 111 and a high bandwidth amplifier 112 that operate in combination with one another to generate the power amplifier supply voltage $V_{CC\_PA}$ based on the envelope signal. The combination of the DC-to-DC converter 111 and the high bandwidth amplifier 112 can provide envelope tracking of wide bandwidth envelope signals, since the DC-to-DC converter 111 can provide superior tracking of low frequency components of the envelope signal while the high bandwidth amplifier 112 can provide superior tracking of high frequency components of the envelope signal. In the illustrated embodiment, an output of the DC-to-DC converter 111 and an output of the high bandwidth amplifier 112 are combined using a combiner 115.

The high bandwidth amplifier 112 can be implemented in a variety of ways, such as using a linear amplifier or a relatively fast digital amplifier. Although an embodiment using a high bandwidth amplifier is shown, other types of amplification circuits can be used.

As shown in FIG. 2A, the envelope tracker 102 further includes an envelope adjustment circuit 110 that provides adjustment to the envelope signal, such as envelope shaping. The envelope adjustment circuit 110 also controls the DC-to-DC converter 111 and the high bandwidth amplifier 112. The envelope tracker 102 also includes a load variation detector 116 used to generate a load variation detection signal based on an output detection signal and an input detection signal from the power amplifier system 101.

The envelope tracker 102 compensates the power amplifier system 101 for output load variation based on the output detection signal and the input detection signal. In particular, the load variation detector 116 generates the load variation detection signal based on determining an output load variation indicated by the output detection signal as compensated for by a nominal variation in output load indicated by the input detection signal. By correcting for nominal output load variation, a component of output load variation corresponding to the power amplifier's standing wave ratio can be detected.

Thus, the envelope tracker 102 can provide compensation for variation in the power amplifier's load line impedance arising from changes in VSWR.

The power amplifier system 101 can include detectors implemented in a wide variety of ways. For example, the power amplifier system 101 can include peak detectors, average detectors, directional couplers, and/or a wide variety of other detector types for generating the output detection signal and/or input detection signal.

In certain implementations, the envelope tracker 102 provides compensation for output load variation based on adjusting a voltage level of the power amplifier supply voltage $V_{CC\_PA}$ based on the load variation detection signal.

In one example, the envelope adjustment circuit 110 includes a shaping table for mapping between envelope signal levels and corresponding shaped envelope signal levels. Additionally, the selected shaped envelope signal level is chosen in part based on the load variation detection signal.

In another example, the envelope adjustment circuit 110 provides gain adjustment to the power amplifier system 101 based on the load variation detection signal.

Thus, the envelope tracker 102 detects the power amplifier system's output load condition as VSWR changes. Additionally, the envelope tracker 102 provides compensation for output load variation to maintain the power amplifier system 101 operating in a region of high efficiency and linearity.

The illustrated RF system 100 advantageously provides correction for output load variation without needing to receive indicators from a transceiver or RFIC. Implementing the RF system 100 in this manner provides enhanced flexibility and/or independence at the system level from other components of a mobile device or other communication device.

Figure 2B:
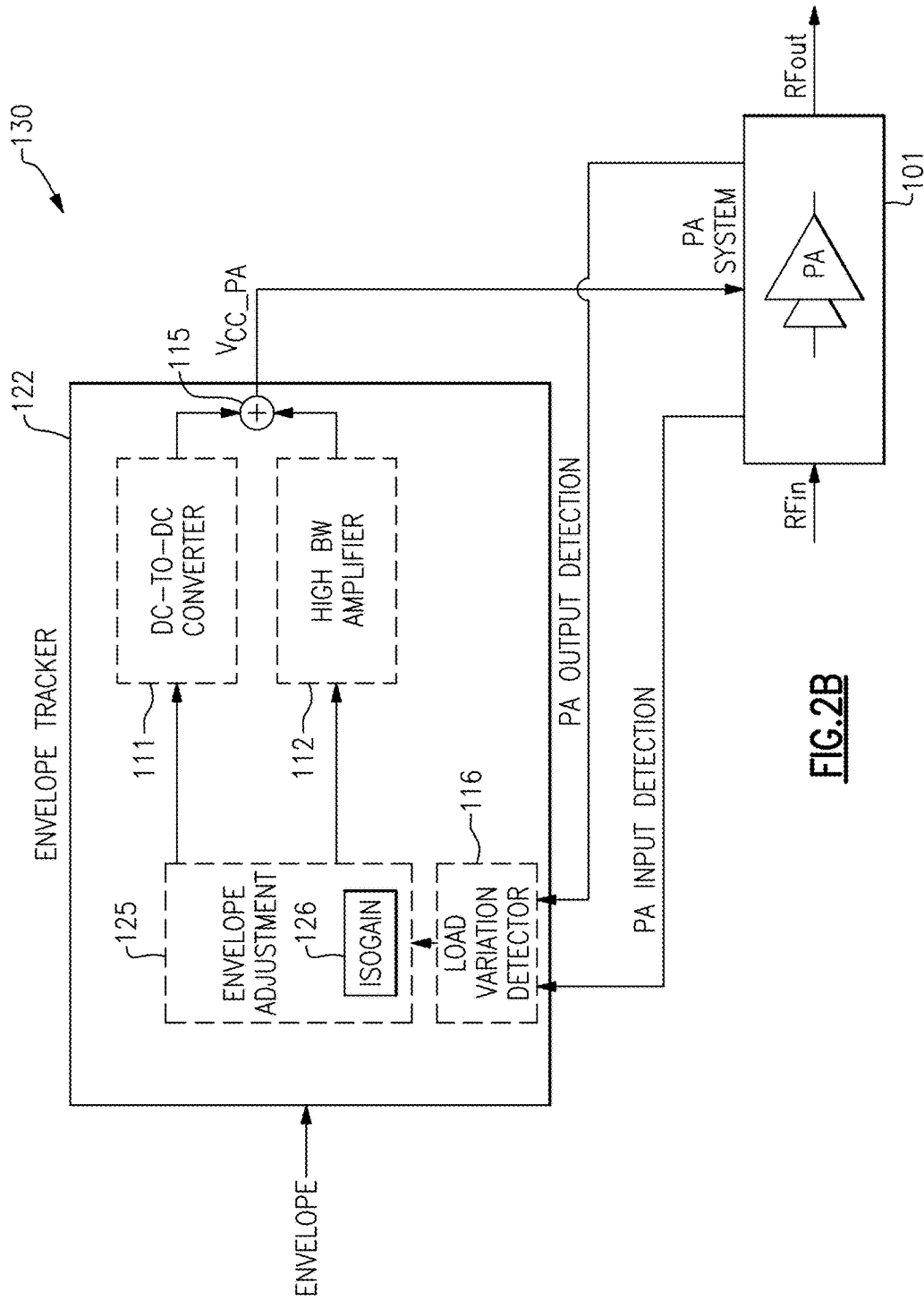
FIG. 2B is a schematic diagram of an RF system including an envelope tracker according to another embodiment.

FIG. 2B is a schematic diagram of an RF system 130 including an envelope tracker 122 according to another embodiment. The RF system 130 of FIG. 2B is similar to the RF system 100 of FIG. 2A, except that the envelope tracker 122 includes an envelope adjustment circuit 125 including an isogain shaping table 126.

The isogain shaping table 126 can be calibrated to providing mapping between envelope signal levels and corresponding shaped envelope signal levels while maintaining a substantially constant gain across an envelope signal range. Configuring the envelope tracker 122 in this manner can provide high linearity over the range of the signal's envelope, thereby helping to ensure that the power amplifier is compliant with a particular communications standard.

In the illustrated embodiment, the selected shaped envelope signal level from the isogain shaping table 126 is chosen in part based on the load variation detection signal from the load variation detector 116. Accordingly, in this embodiment the power amplifier system 101 is compensated for output load variation arising from changes to VSWR based on the value selected from the isogain shaping table 126.

Figure 2C:
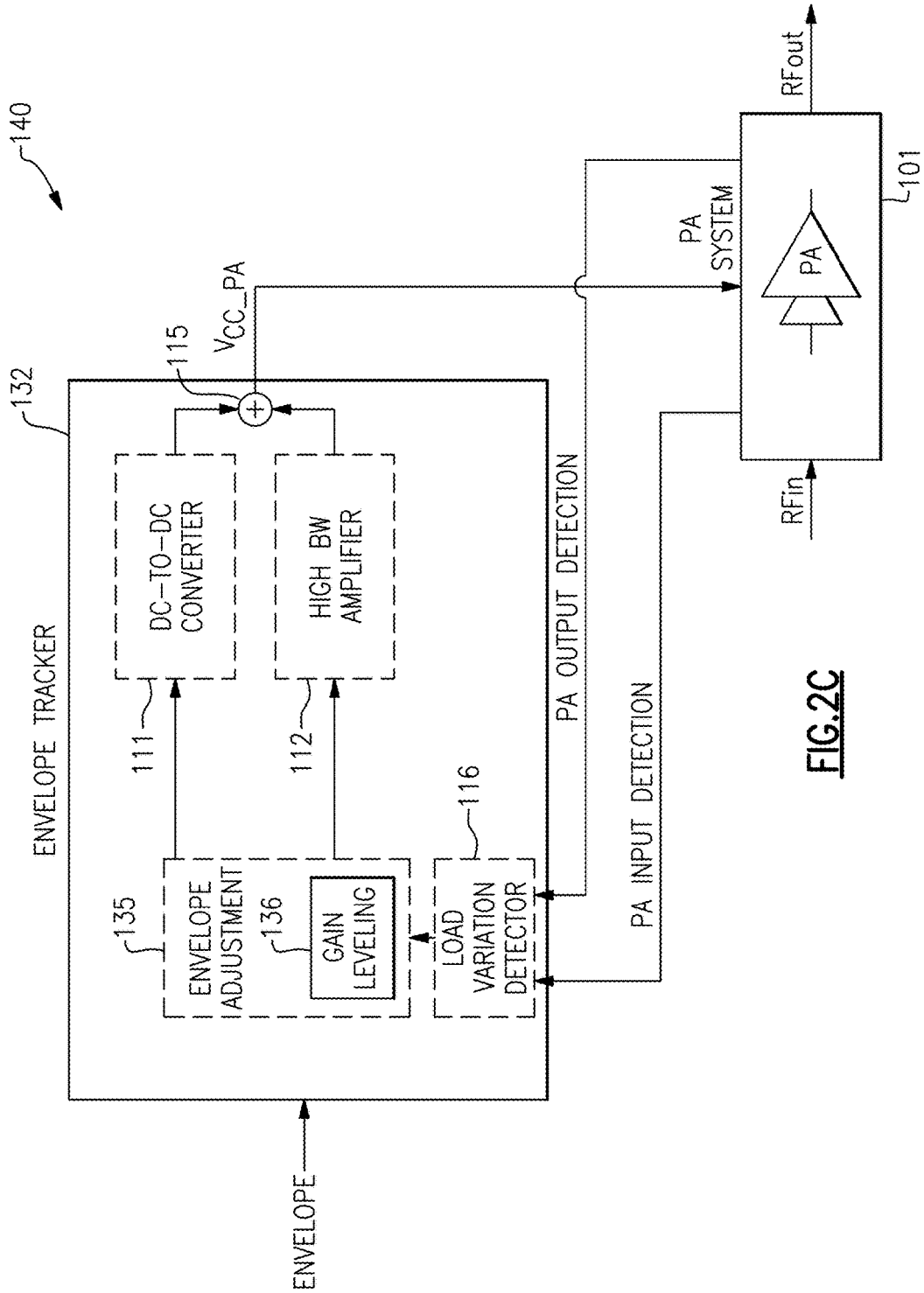
FIG. 2C is a schematic diagram of an RF system including an envelope tracker according to another embodiment.

FIG. 2C is a schematic diagram of an RF system 140 including an envelope tracker 132 according to another embodiment. The RF system 140 of FIG. 2C is similar to the RF system 100 of FIG. 2A, except that the envelope tracker 132 includes an envelope adjustment circuit 135 including a gain leveling circuit 136. The gain leveling circuit 136 provides leveling control to maintain a power amplifier gain substantially constant across an envelope signal range.

In the illustrated embodiment, an adjustment to the gain leveling circuit 136 (for instance, a correction to an amount of gain leveling provided) is made based on the load variation detection signal to thereby provide compensation for output load variation.

Figure 2D:
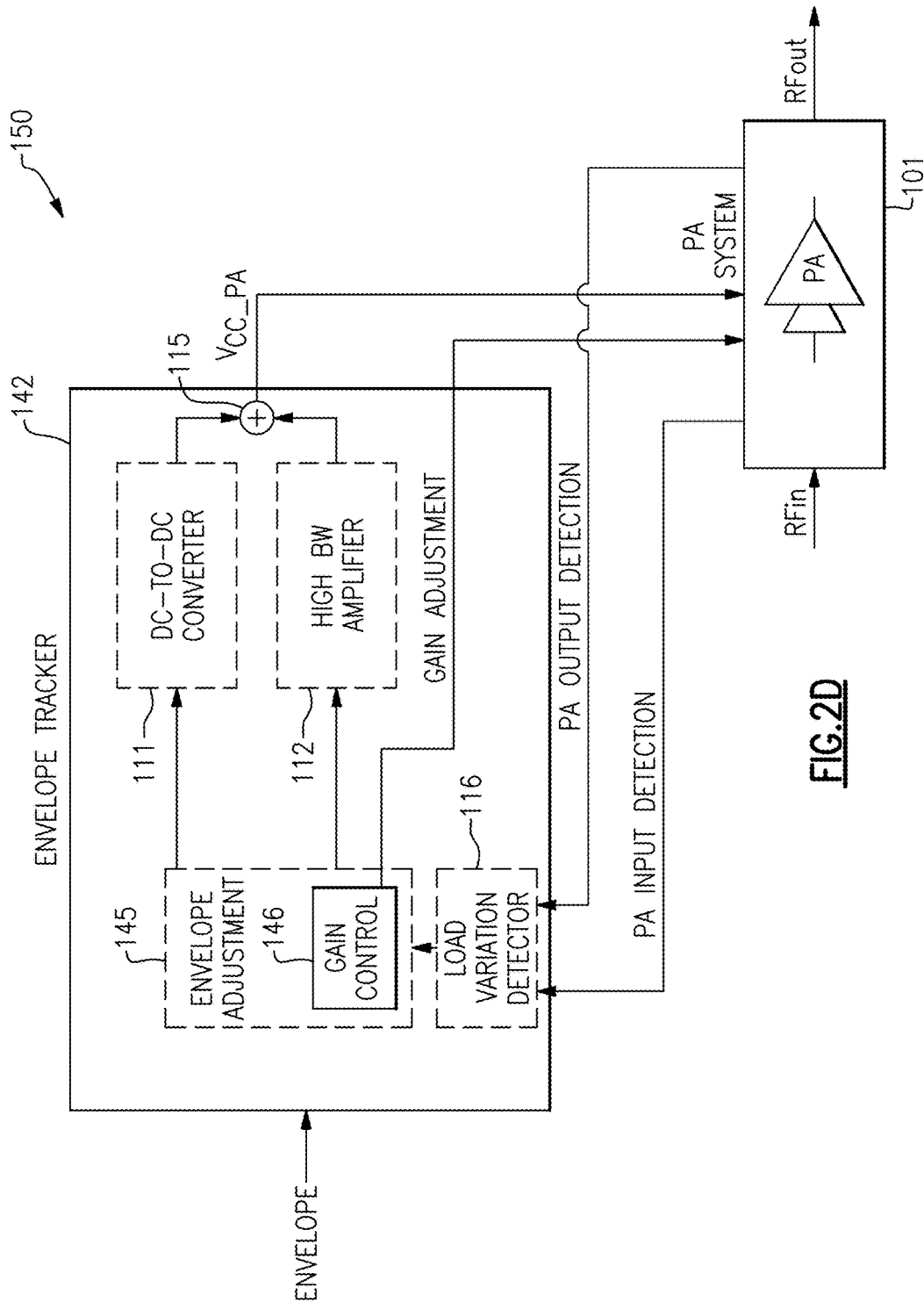
FIG. 2D is a schematic diagram of an RF system including an envelope tracker according to another embodiment.

FIG. 2D is a schematic diagram of an RF system 150 including an envelope tracker 142 according to another embodiment. The RF system 150 of FIG. 2D is similar to the RF system 100 of FIG. 2A, except that the envelope tracker 142 includes an envelope adjustment circuit 145 including a gain control circuit 146.

In the illustrated embodiment, the gain control circuit 146 provides gain adjustment to the power amplifier system 101 based on the load variation detection signal from the load variation detector 116. Accordingly, in this embodiment the envelope tracker 142 provides gain adjustment to the power amplifier system 101 to compensate for output load variation arising from changes to VSWR.

The gain control circuit 146 can provide gain adjustment to the power amplifier system 101 in a variety of ways. For example, the gain of the power amplifier system 101 can be adjusted by controlling a bias of a transistor (for instance a base bias of a bipolar transistor and/or a gate bias of a field-effect transistor). Additionally, although illustrated in the context of a single gain adjustment signal, the envelope tracker 142 can provide gain adjustment in a variety of ways, such as by using multiple gain adjustment signals to control the gain of one or more power amplifier stages.

Figure 3A:
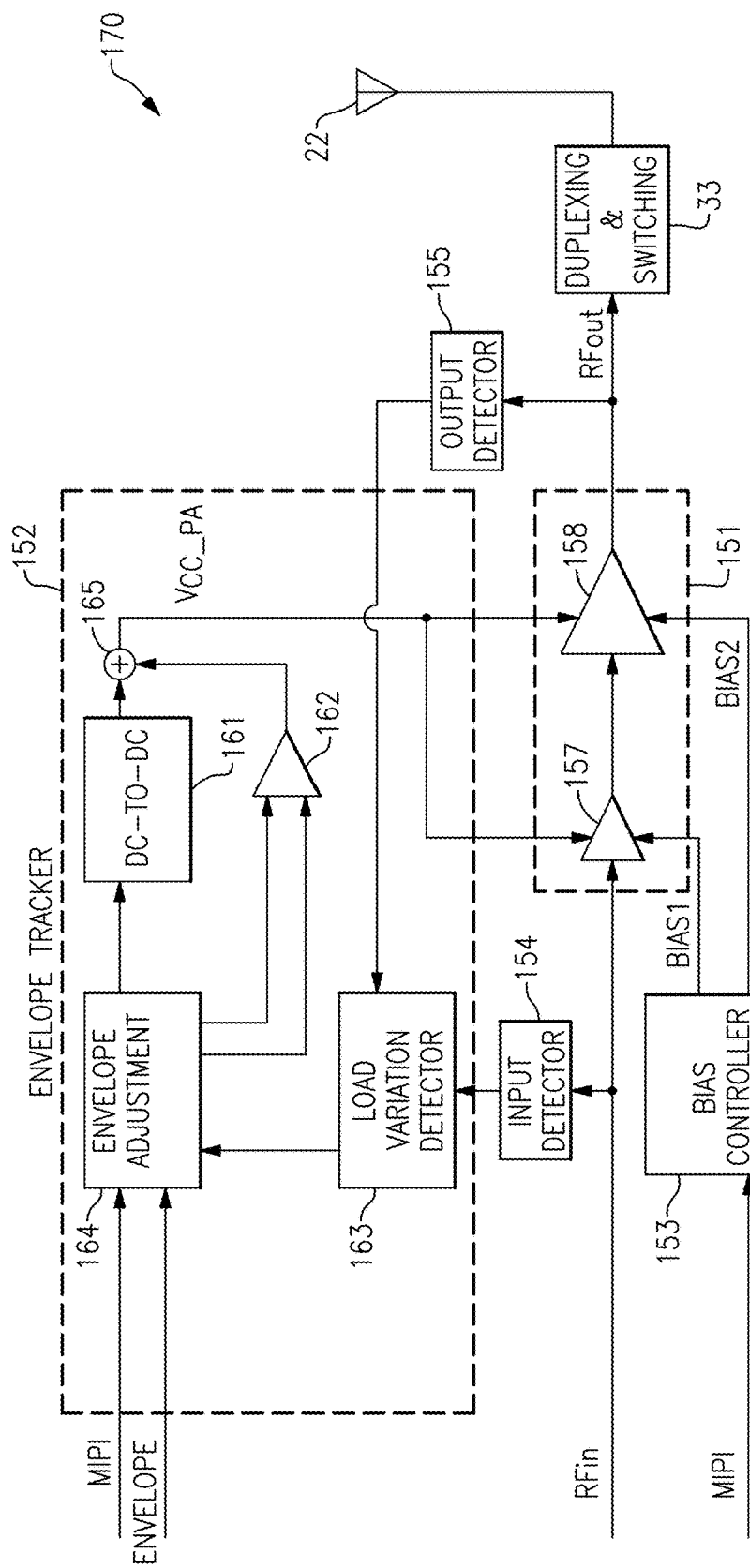
FIG. 3A is schematic diagram of an RF system according to another embodiment.

FIG. 3A is schematic diagram of an RF system 170 according to another embodiment. The RF system 170 includes an antenna 22, a duplexing and switching circuit 33, a power amplifier 151, an envelope tracker 152, a bias controller 153, an input detector 154, and an output detector 155.

The power amplifier 151 provides amplification to a radio frequency signal RFin, and provides an amplified radio frequency signal RFout to the antenna 22 via the duplexing and switching circuit 33. In the illustrated embodiment, the power amplifier 151 includes a first stage 157 and a second stage 158, which are in a cascade. Thus, the power amplifier 151 is a multi-stage power amplifier, in this embodiment.

The bias controller 153 generates a first bias signal BIAS1 for the first stage 157 of the power amplifier 151, and a second bias signal BIAS2 for the second stage 158 of the power amplifier 151. The first bias signal BIAS1 and the second bias signal BIAS2 can include a bias current, a bias voltage, or a combination thereof. In certain configurations, the bias controller 153 is implemented using a manufacturing technology suitable for fabricating metal oxide semiconductor (MOS) transistors, such as a complementary metal oxide semiconductor (CMOS) process.

The illustrated envelope tracker 152 includes a DC-to-DC converter 161, an amplifier 162, a load variation detection circuit 163, an envelope adjustment circuit 164, and a combiner 165. In the illustrated embodiment, an output of the DC-to-DC converter 161 and an output of the amplifier 162 are combined using the combiner 165.

As shown in FIG. 3A, the power amplifier supply voltage $V_{CC\_PA}$ is controlled based on an output of the DC-to-DC converter 161 and on an output of the amplifier 162. The envelope adjustment circuit 164 receives an envelope signal, and processes the envelope signal to generate a shaped envelope signal and control signals suitable for controlling the DC-to-DC converter 161 and the amplifier 162.

In the illustrated embodiment, the RF system 170 communicates with external circuitry (for instance, a transceiver or RFIC) via a serial interface, such as a Mobile Industry Processor Interface (MIPI) radio frequency front end (RFFE) bus. For example, the serial interface can be used to control bias settings of the bias controller 153 and/or to provide data to the envelope tracker 152, such as data identifying operating mode, operating band, and/or characteristics of the radio frequency signal RFin.

The input detector 154 is coupled to an input of the power amplifier 151 and generates an input detection signal. Additionally, the output detector 155 is coupled to an output of the power amplifier 151 and generates an output detection signal. The envelope tracker 152 generates the power amplifier supply voltage $V_{CC\_PA}$ for the power amplifier 151 based on the envelope signal. Additionally, the envelope tracker 152 compensates the power amplifier 151 for output load variation based on the output detection signal and the input detection signal.

For example, the load variation detector 163 processes the output detection signal and the input detection signal to generate a load variation detection signal corresponding to an output load variation indicated by the output detection signal as compensated for by a nominal variation in output load indicated by the input detection signal. Additionally, the envelope tracker 152 uses the load variation detection signal to compensate for output load variation corresponding to the power amplifier's standing wave ratio.

Accordingly, the envelope tracker 152 provides compensation for variation in the power amplifier's load line impedance arising from changes in VSWR of the antenna 22.

The output load detector 155 can be implemented in a wide variety of ways.

In a first example, the output detector 155 detects the standing wave voltage at the power amplifier's output. For instance, the output detector 155 can be implemented as a peak detector.

In a second example, the output detector 155 generates the output detection signal to indicate a voltage gain of the power amplifier 151, which can be compared to a target gain using the envelope tracker 152. For instance, the output detector 155 can be implemented as an average detector.

In a third example, the output detector 155 measures both the voltage gain and the forward gain at the output of the power amplifier 151, which can be compared to one another. For instance, the output detector 155 can include an average detector for measuring voltage gain and a directional coupler for measuring forward gain.

In a fourth example, the output detector 155 measures a forward wave and a reverse wave at the power amplifier's output. For instance, the output detector 155 can include a directional coupler for measuring a forward wave and a reverse wave at the output of the power amplifier 151.

As shown in FIG. 3A, the output detector 155 provides output detection at the output of the power amplifier 151 prior to the duplexing and switching circuit 33. Implementing output detection in this manner provides output detection of higher accuracy. For instance, the output detection signal does not include insertion loss associated with the duplexing and switching circuit 33.

The input detector 154 can be implemented in a wide variety of ways, including, but not limited to, using a peak detector, an average detector, a directional coupler, or a combination thereof. In certain implementations, the input detector 154 is operable to detect an input power level of the RF input signal RFin.

In certain implementations, the envelope tracker 152 provides compensation for output load variation based on adjusting at least one of a voltage level of the power amplifier supply voltage $V_{CC\_PA}$ or a gain of the power amplifier 151 based on the load variation detection signal.

The envelope tracker 152 can detect an output load condition as VSWR changes. Additionally, the envelope tracker 152 provides compensation for output load variation to maintain the power amplifier 151 in a region of high efficiency and linearity. For instance, the envelope tracker 152 can lower a voltage at the power amplifier's output when output load impedance is relatively low, and increase the voltage at the power amplifier's output when output load impedance is relatively high. The compensation is provided dynamically during operation of the mobile phone or other communication device that includes the RF system 170.

Figure 3B:
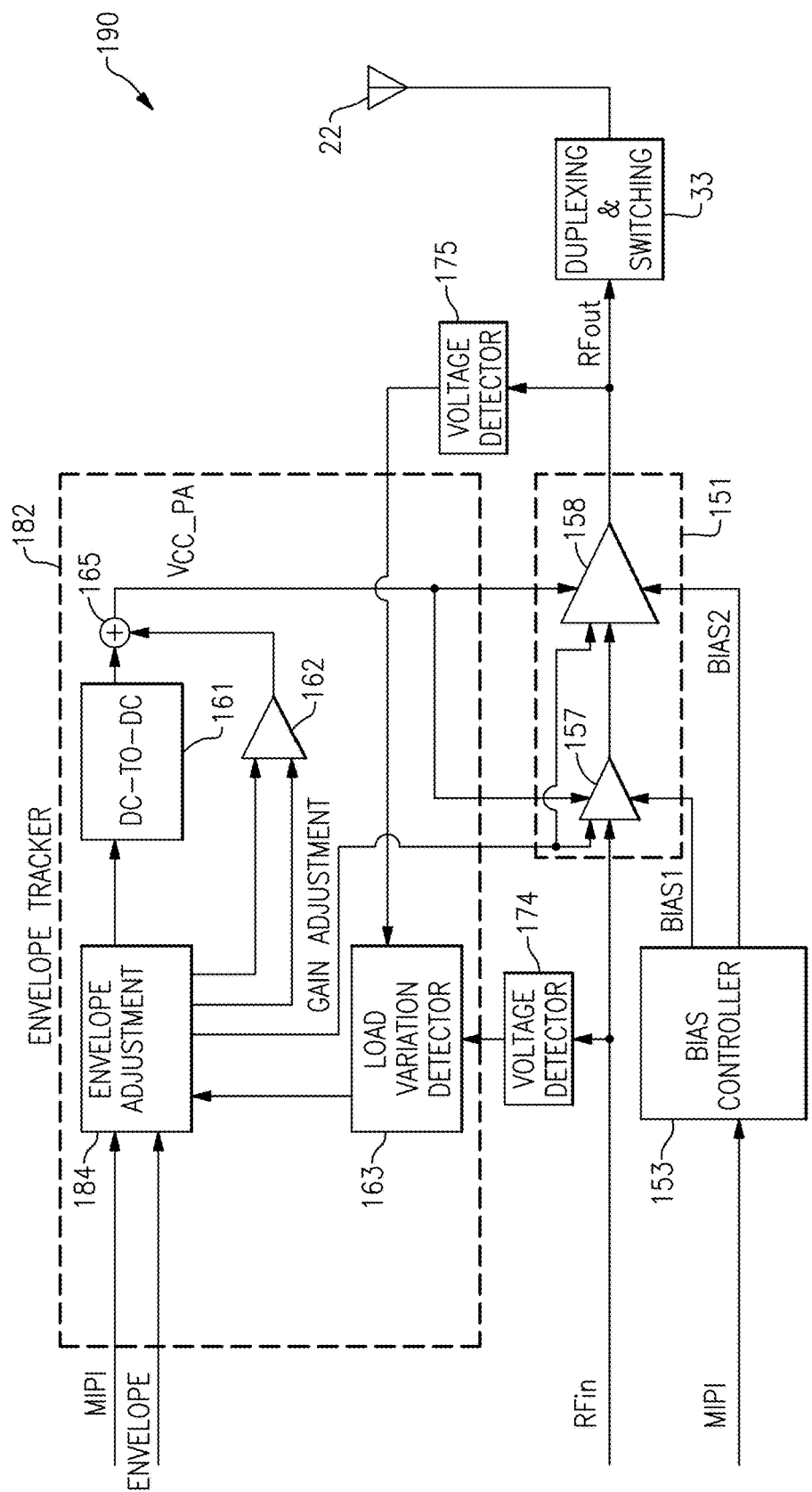
FIG. 3B is schematic diagram of an RF system according to another embodiment.

FIG. 3B is schematic diagram of an RF system 190 according to another embodiment. The RF system 190 of FIG. 3B is similar to the RF system 170 of FIG. 3A, except that the RF system 190 illustrates a specific implementation of an input detector implemented as an input voltage detector 174 and of an output detector implemented as an output voltage detector 175. Additionally, the RF system 190 includes an envelope tracker 182 that controls an amount of gain of the power amplifier 151.

The input voltage detector 174 and the output voltage detector 175 can be implemented in a wide variety of ways, such as using peak detectors and/or average detectors.

In one example, a detector can include a diode and a capacitor of a size suitable for detecting a peak of an RF signal.

In another example, a detector can include a diode and a capacitor of a size suitable for detecting an average of an RF signal.

In yet another example, a detector can include a non-linear amplifier (for instance, a log amp) implemented to detect a peak and/or an average of an RF signal.

Although various examples of detectors have been described, input and output detectors can be implemented in a wide variety of ways.

Figure 3C:
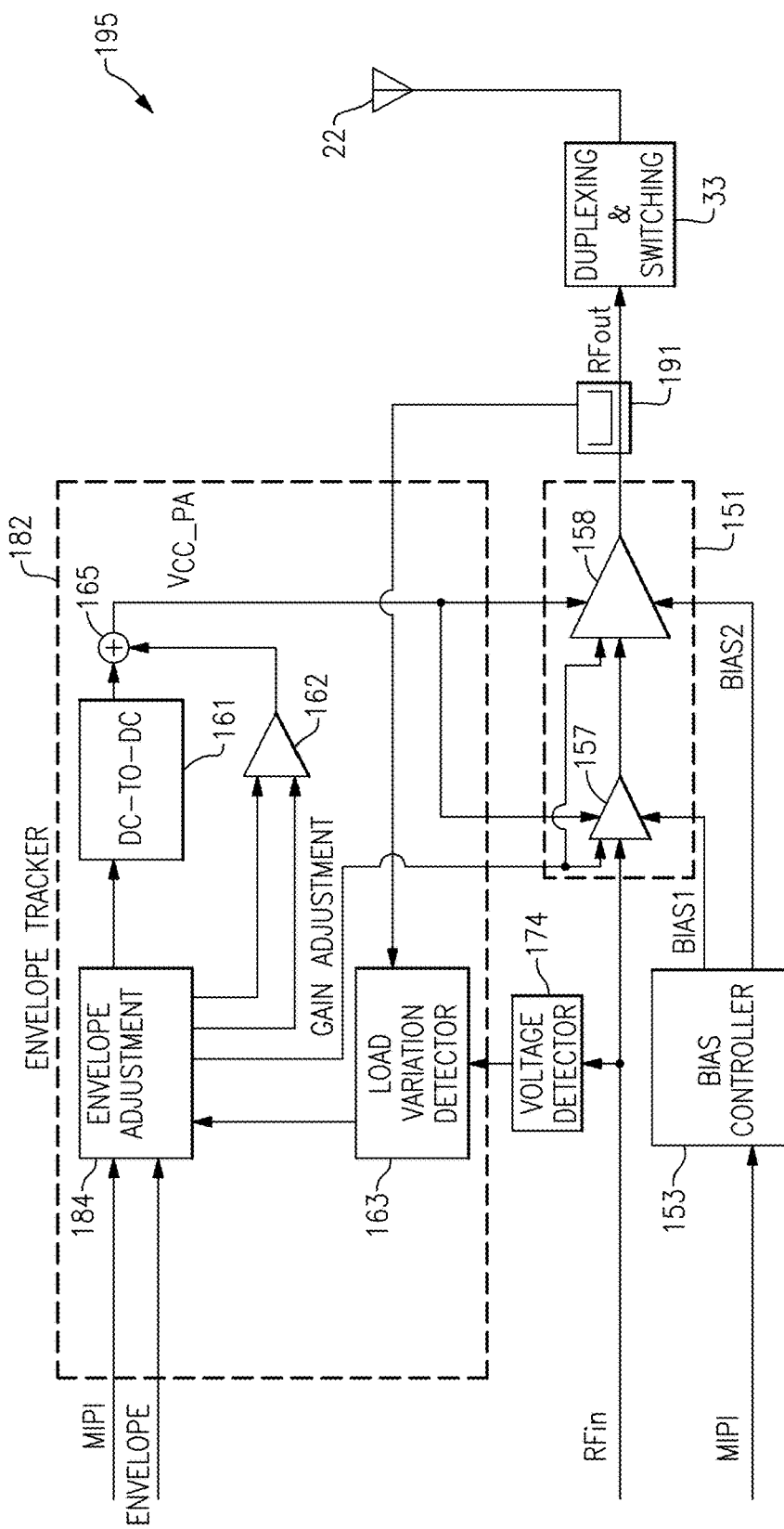
FIG. 3C is schematic diagram of an RF system according to another embodiment.

FIG. 3C is schematic diagram of an RF system 195 according to another embodiment. The RF system 195 of FIG. 3C is similar to the RF system 190 of FIG. 3B, except that the RF system 195 illustrates an implementation with an output detector implemented as a directional coupler 191.

The directional coupler 191 can be used to measure a forward wave at the output of the power amplifier 151, a reverse wave at the output of the power amplifier 151, or both the forward wave and the reverse wave at the output of the power amplifier 151.

Figure 3D:
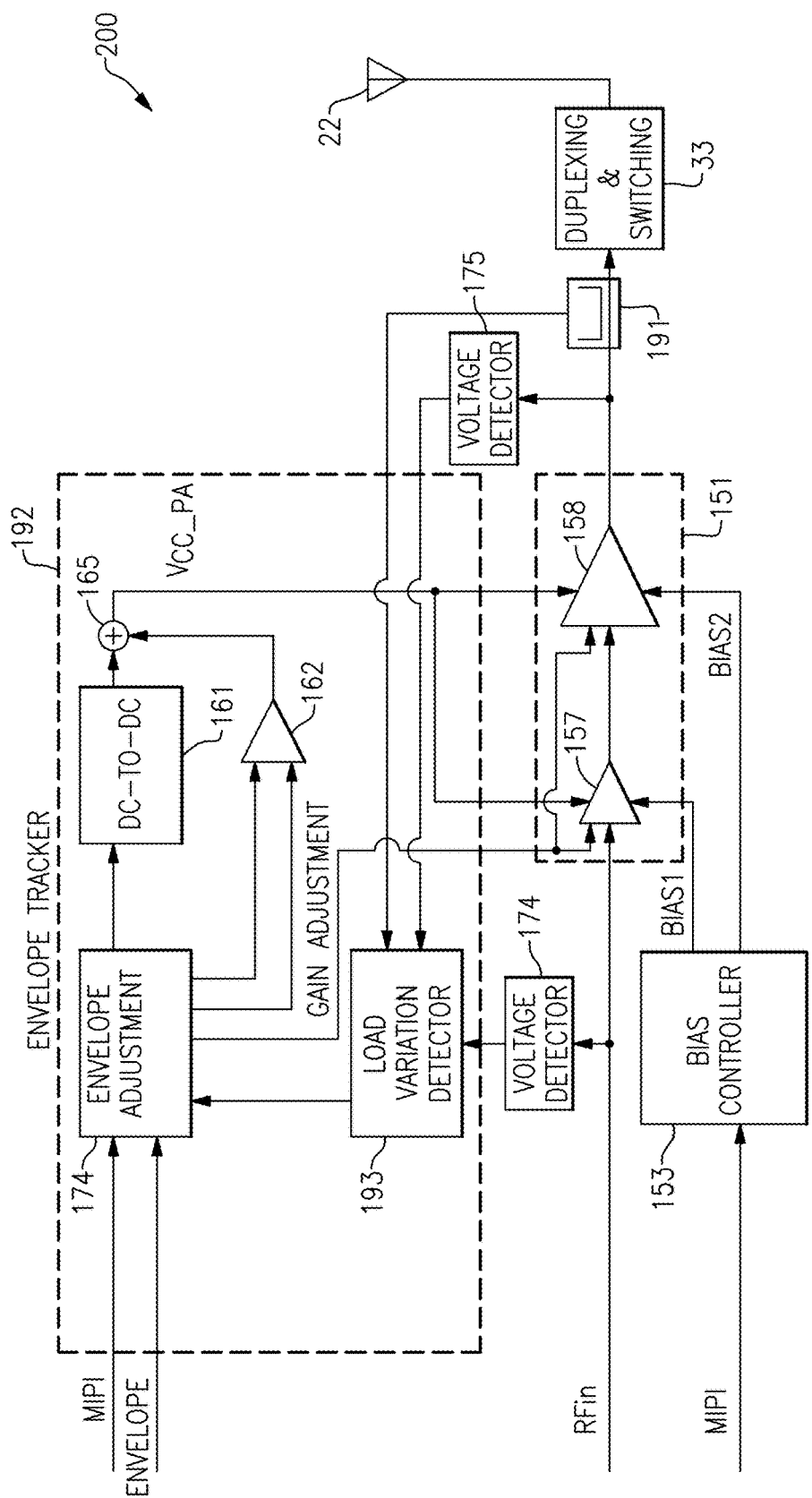
FIG. 3D is schematic diagram of an RF system according to another embodiment.

FIG. 3D is schematic diagram of an RF system 200 according to another embodiment. The RF system 200 of FIG. 3D is similar to the RF system 190 of FIG. 3B, except that the RF system 200 illustrates an implementation with an output detector implemented as both an output voltage detector 175 and a directional coupler 191.

Output load variation of a power amplifier can be detected using detectors implemented in a wide variety of ways.

In a first example, an output detector detects the standing wave voltage at the power amplifier's output. For instance, the output detector can be implemented as a peak detector.

In a second example, the output detector generates the output detection signal to indicate a voltage gain of the power amplifier, which can be compared to a target gain. For instance, the output detector can be implemented as an average detector.

In a third example, the output detector measures both the voltage gain and the forward gain at the output of the power amplifier, which can be compared to one another. For instance, the output detector can include an average detector for measuring voltage gain and a directional coupler for measuring forward gain.

In a fourth example, the output detector measures a forward wave and a reverse wave at the power amplifier's output. For instance, the output detector can include a directional coupler for measuring a forward wave and a reverse wave at the output of the power amplifier.

Figure 4A:
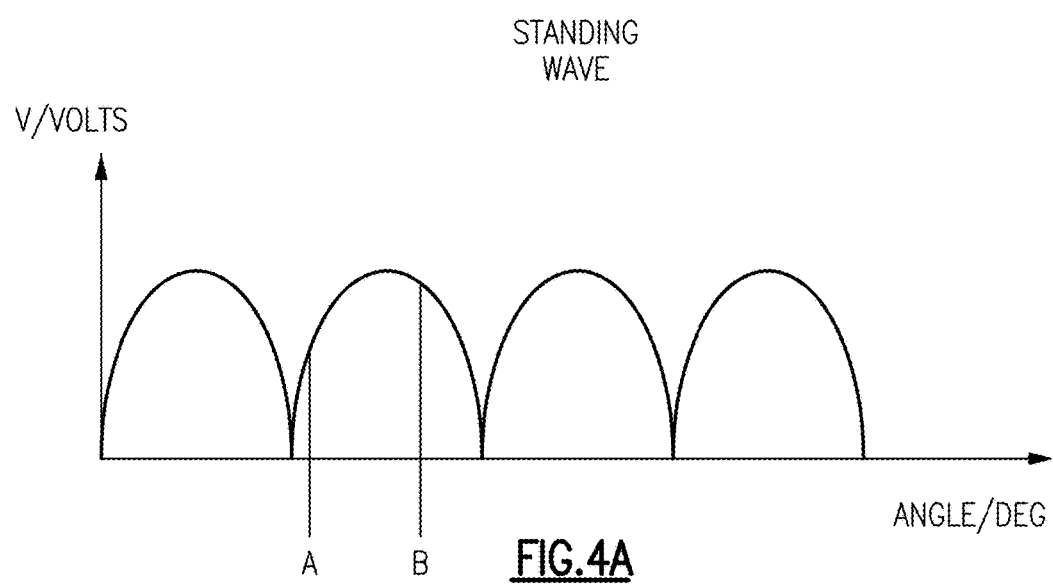
FIG. 4A is a graph of one example of voltage versus phase angle for a standing wave.

FIG. 4A is a graph of one example of voltage versus phase angle for a standing wave. When the standing wave is present at a power amplifier's output, the power amplifier's load line changes with the phase angle of the standing wave. For example, as shown in FIG. 4A, the load line of the power amplifier at angle A is different from the load line at angle B.

Since variation in a VSWR condition of an antenna can lead to a change in the standing wave ratio at the output of power amplifier, changes in VSWR can lead to load line changes.

Figure 4B:
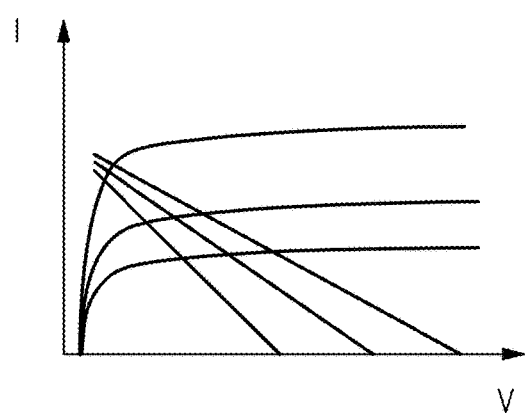
FIG. 4B is one example of a graph of current versus voltage for a power amplifier.

FIG. 4B is one example of a graph of current versus voltage for a power amplifier. The graph depicts that a load line presented to a power amplifier changes based on power amplifier bias.

Although FIGS. 4A-4B illustrate various graphs of power amplifier performance characteristics, a power amplifier can be implemented in a variety of ways, such as in a manner suited for a particular application and/or communication standard. Accordingly, the graphs are included for illustrative purposes only, and other simulation and/or measurement results are possible.

Figure 5A:
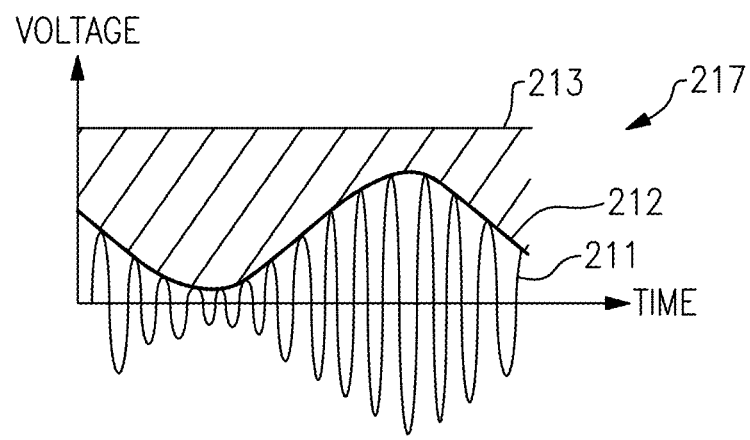
FIG. 5A is a graph showing a first example of power amplifier supply voltage versus time.

FIG. 5A is a graph 217 showing a first example of power amplifier supply voltage versus time. The graph 217 illustrates the voltage of an RF signal 211, the RF signal's envelope 212, and a power amplifier supply voltage 213 versus time. The graph 217 corresponds to one example of waveforms for an implementation in which the power amplifier supply voltage 213 is substantially fixed.

It can be important that the power amplifier supply voltage 213 of a power amplifier has a voltage greater than that of the RF signal 211. For example, powering a power amplifier using a power amplifier supply voltage that has a magnitude less than that of the RF signal can clip the RF signal, thereby creating signal distortion and/or other problems. Thus, it can be important the power amplifier supply voltage 213 be greater than that of the envelope 212. However, it can be desirable to reduce a difference in voltage between the power amplifier supply voltage 213 and the envelope 212 of the RF signal 211, as the area between the power amplifier supply voltage 213 and the envelope 212 can represent lost energy, which can reduce battery life and increase heat generated in a wireless device.

Figure 5B:
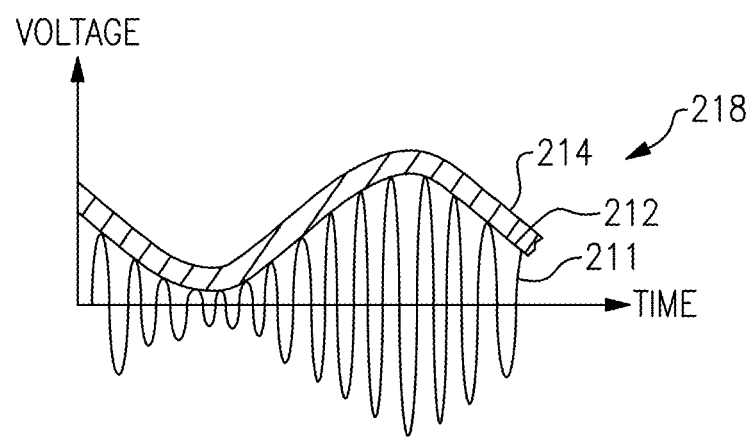
FIG. 5B is a graph showing a second example of power amplifier supply voltage versus time.

FIG. 5B is a graph 218 showing a second example of power amplifier supply voltage versus time. The graph 218 illustrates the voltage of an RF signal 211, the RF signal's envelope 212, and a power amplifier supply voltage 214 versus time. The graph 218 corresponds to one example of waveforms for an implementation in which the power amplifier supply voltage 214 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 213 of FIG. 5A, the power amplifier supply voltage 214 of FIG. 5B changes in relation to the envelope 212 of the RF signal 211. The area between the power amplifier supply voltage 214 and the envelope 212 in FIG. 5B is less than the area between the power amplifier supply voltage 213 and the envelope 212 in FIG. 5A, and thus the graph 218 of FIG. 5B can be associated with a power amplifier system having greater energy efficiency.

Figure 6:
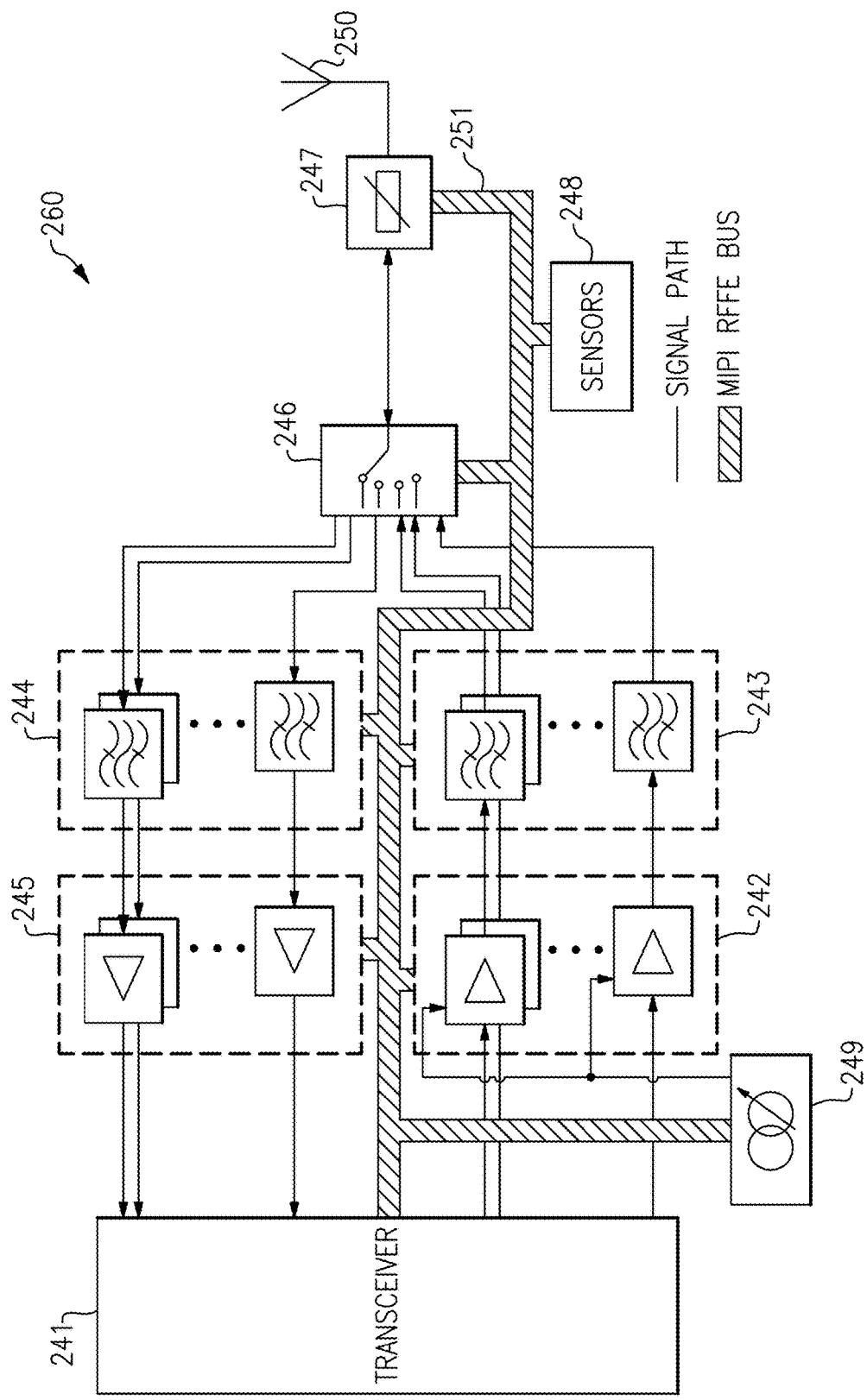
FIG. 6 is a schematic diagram of one embodiment of a communication system.

FIG. 6 is a schematic diagram of one embodiment of a communication system 260 including a MIPI RFFE bus 251. The communication system 260 further includes a transceiver 241, a power amplifier module 242, a transmit filter module 243, a receive filter module 244, a low noise amplifier (LNA) module 245, an antenna switch module 246, a coupler module 247, a sensor module 248, a power management module 249, and an antenna 250.

As shown in FIG. 6, various components of the communication system 260 are interconnected by the MIPI RFFE bus 251. Additionally, the transceiver 241 includes a master device of the MIPI RFFE bus 251, and each of the RF components includes a slave device of the MIPI RFFE bus 251. The master device of the transceiver 241 sends control commands over the MIPI RFFE bus 251 to configure the communication system 260 during initialization and/or while operational.

The power amplifier module 242 can include one or more power amplifiers. As shown in FIG. 6, the power amplifier module 242 receives one or more power amplifier supply voltages from the power management module 249. The power management module 249 can include an envelope tracker that generates at least one power amplifier supply voltage, and that is implemented in accordance with the teachings herein.

Although FIG. 6 illustrates one example of a communication system including a power management module and a power amplifier module, the teachings herein are applicable to communication systems implemented in a wide variety of ways.

Figure 7A:
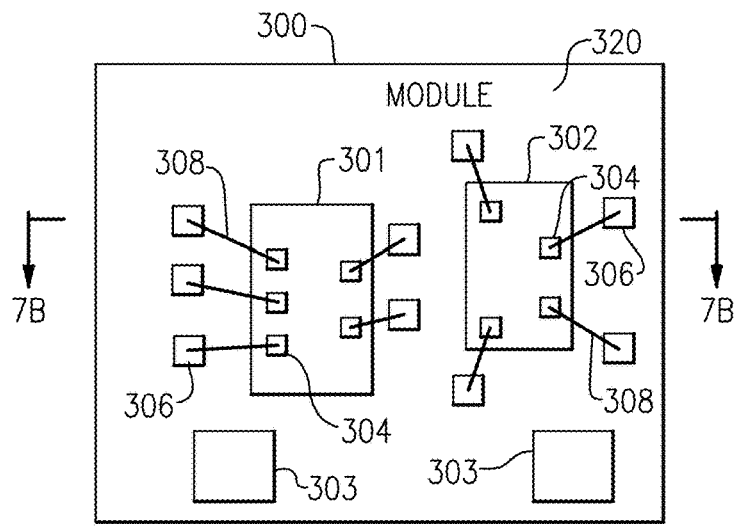
FIG. 7A is a schematic diagram of one embodiment of a packaged module.
Figure 7B:
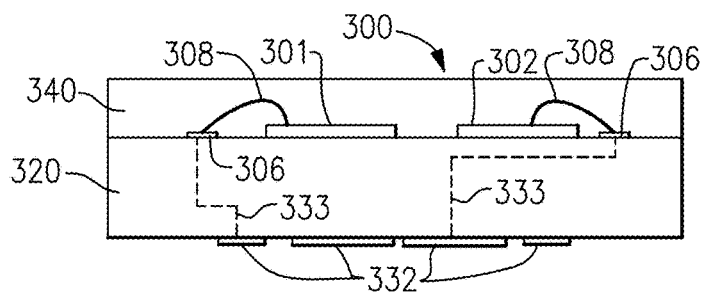
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B. The packaged module 300 illustrates an example of a module that can include circuitry implemented in accordance with one or more features of the present disclosure.

The packaged module 300 includes a first die 301, a second die 302, surface mount components 303, wirebonds 308, a package substrate 320, and encapsulation structure 340. The package substrate 320 includes pads 306 formed from conductors disposed therein. Additionally, the dies 301, 302 include pads 304, and the wirebonds 308 have been used to connect the pads 304 of the dies 301, 302 to the pads 306 of the package substrate 320.

In certain implementations, the dies 301, 302 are manufactured using different processing technologies. In one example, the first die 301 is manufactured using a compound semiconductor process, and the second die 302 is manufactured using a silicon process. Although an example with two dies is shown, a packaged module can include more or fewer dies.

The packaging substrate 320 can be configured to receive a plurality of components such as the dies 301, 302 and the surface mount components 303, which can include, for example, surface mount capacitors and/or inductors.

As shown in FIG. 7B, the packaged module 300 is shown to include a plurality of contact pads 332 disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, ground, and/or supply voltage(s) to the dies 301, 302 and/or the surface mount components 303. As shown in FIG. 7B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 8:
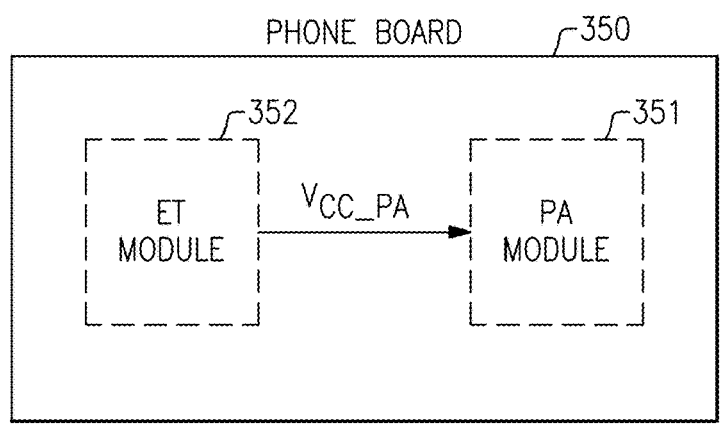
FIG. 8 is a schematic diagram of one embodiment of a phone board.

FIG. 8 is a schematic diagram of one embodiment of a phone board 350. The phone board 350 includes an envelope tracking module 352 and a power amplifier module 351 attached thereto. In certain configurations, the power amplifier module 351 and/or the envelope tracking module 352 are implemented using one or more instantiations of the module 300 shown in FIGS. 7A-7B. As shown in FIG. 8, the envelope tracking module 352 provides a power amplifier supply voltage $V_{CC\_PA}$ to the power amplifier module 351. Additionally, the envelope tracking module 352 controls the power amplifier supply voltage $V_{CC\_PA}$ to change in relation to the envelope of an RF signal amplified by the power amplifier module 351.

Although not illustrated in FIG. 8 for clarity, the phone board 350 includes additional components and structures.

Figure 9:
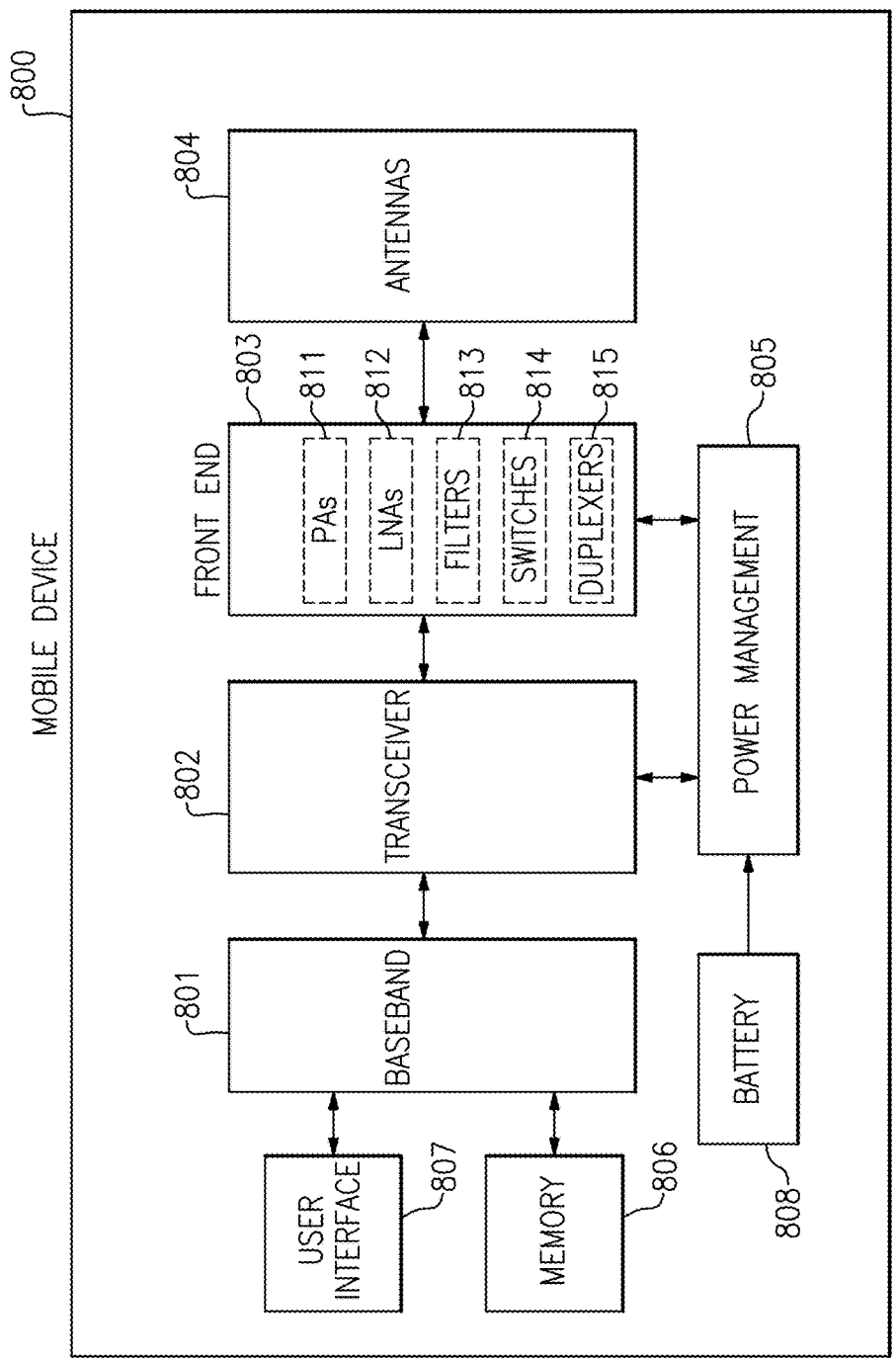
FIG. 9 is a schematic diagram of one embodiment of a mobile device.

FIG. 9 is a schematic diagram of one example of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an envelope tracker implemented in accordance with one or more features of the present disclosure. For example, the envelope tracker can compensate one or more of the power amplifiers 811 for output load variation, such as changes to load line impedance arising from variation in a VSWR condition of the antennas 804.

As shown in FIG. 9, the power management system 805 receives a battery voltage form the battery 808. The battery 808 can be any suitable battery for use in the mobile device 800, including, for example, a lithium-ion battery.

CONCLUSION

Some of the embodiments described above have provided examples in connection with mobile phones. However, the principles and advantages of the embodiments can be used for any other systems or apparatus that have needs for power amplifier systems.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency system comprising:
   a power amplifier including an input configured to receive a radio frequency signal and an output configured to provide an amplified radio frequency signal, the power amplifier configured to receive power from a power amplifier supply voltage;
   an output detector coupled to the output of the power amplifier and configured to generate an output detection signal;
   an input detector coupled to the input of the power amplifier and configured to generate an input detection signal; and
   an envelope tracker configured to generate the power amplifier supply voltage based on an envelope of the radio frequency signal, and to compensate the power amplifier for output load variation based on the output detection signal and the input detection signal.

2. The radio frequency system of claim 1 wherein the output detection signal indicates a voltage gain at the output of the power amplifier, the envelope tracker configured to provide compensation for output load variation based on comparing the voltage gain to a target gain.

3. The radio frequency system of claim 1 wherein the output detection signal indicates both a voltage gain and a forward gain at the output of the power amplifier, the envelope tracker configured to provide compensation for output load variation based on comparing the voltage gain to the forward gain.

4. The radio frequency system of claim 1 wherein the output detection signal indicates both a forward wave and a reverse wave at the output of the power amplifier.

5. The radio frequency system of claim 1 wherein the envelope tracker includes a load variation detector configured to generate a load variation detection signal based on compensating an output load variation indicated by the output detection signal by a nominal output load variation indicated by the input detection signal.

6. The radio frequency system of claim 5 wherein the envelope tracker is configured to adjust at least one of a voltage level of the power amplifier supply voltage or a gain of the power amplifier based on the load variation detection signal.

7. The radio frequency system of claim 5 wherein the envelope tracker includes an envelope modulator configured to generate the power amplifier supply voltage based on a shaped envelope signal, and an envelope adjustment circuit configured to generate the shaped envelope signal based on shaping the envelope of the radio frequency signal.

8. The radio frequency system of claim 7 wherein the envelope adjustment circuit includes a shaping table, the envelope adjustment circuit configured to select a gain adjustment value of the shaping table based on the load variation detection signal.

9. The radio frequency system of claim 1 further comprising a duplexing and switching circuit coupled to the output of the power amplifier, the output detector configured to provide output detection prior to the duplexing and switching circuit.

10. A mobile device comprising:
   a transceiver configured to generate a radio frequency signal;
   a front end system including a power amplifier configured to provide amplification to the radio frequency signal, an output detector configured to generate an output detection signal indicating an output signal condition of the power amplifier, and an input detector configured to generate an input detection signal indicating an input signal condition of the power amplifier; and
   a power management system including an envelope tracker configured to generate a power amplifier supply voltage of the power amplifier based on an envelope of the radio frequency signal, the envelope tracker configured to compensate the power amplifier for output load variation based on the output detection signal and the input detection signal.

11. The mobile device of claim 10 further comprising an antenna configured to receive an amplified radio frequency signal from the power amplifier, the envelope tracker configured to compensate the power amplifier for output load variation arising from a voltage standing wave ratio condition of the antenna.

12. The mobile device of claim 10 wherein the output detection signal indicates a voltage gain of the power amplifier, the envelope tracker configured to provide compensation for output load variation based on comparing the voltage gain to a target gain.

13. The mobile device of claim 10 wherein the output detection signal indicates both a voltage gain and a forward gain of the power amplifier, the envelope tracker configured to provide compensation for output load variation based on comparing the voltage gain to the forward gain.

14. The mobile device of claim 10 wherein the envelope tracker includes a load variation detector configured to generate a load variation detection signal based on compensating an output load variation indicated by the output detection signal by a nominal output load variation indicated by the input detection signal.

15. The mobile device of claim 14 wherein the envelope tracker is configured to adjust at least one of a voltage level of the power amplifier supply voltage or a gain of the power amplifier based on the load variation detection signal.

16. The mobile device of claim 14 wherein the envelope tracker includes an envelope modulator configured to generate the power amplifier supply voltage based on a shaped envelope signal, and an envelope adjustment circuit configured to generate the shaped envelope signal based on shaping the envelope of the radio frequency signal.

17. The mobile device of claim 16 wherein the envelope adjustment circuit includes a shaping table, the envelope adjustment circuit configured to select a gain adjustment value of the shaping table based on the load variation detection signal.

18. A method of envelope tracking in a radio frequency system, the method comprising:
   amplifying a radio frequency signal using a power amplifier;
   generating an output detection signal indicating an output signal condition of the power amplifier using an output detector of the power amplifier;
   generating an input detection signal indicating an input signal condition of the power amplifier using an input detector of the power amplifier;
   generating a power amplifier supply voltage for the power amplifier based on an envelope of the radio frequency signal using an envelope tracker; and
   compensating the power amplifier for output load variation based on the output detection signal and the input detection signal using the envelope tracker.

19. The method of claim 18 further comprising compensating the power amplifier for output load variation arising from a voltage standing wave ratio condition of an antenna.

20. The method of claim 18 further comprising generating a load variation detection signal based on compensating an output load variation indicated by the output detection signal by a nominal output load variation indicated by the input detection signal, and providing compensation for output load variation based on the load variation detection signal.

* * * * *